(12) United States Patent
Liu et al.

(10) Patent No.: US 12,394,626 B2
(45) Date of Patent: Aug. 19, 2025

(54) METHOD OF FORMING A STRUCTURE AND SYSTEM FOR SAME

(71) Applicant: ASM IP Holding B.V., Almere (NL)

(72) Inventors: Zecheng Liu, Kanagawa (JP); Takashi Yoshida, Fuchu (JP); Ryu Nakano, Kanagawa (JP); Ivan Zyulkov, Brussels (BE); Yiting Sun, Leuven (BE); Yoann Francis Tomczak, Leuven (BE); David de Roest, Kessel-Lo (BE)

(73) Assignee: ASM IP Holding B.V., Almere (NL)

( * ) Notice: Subject to any disclaimer, the term of this patent is extended or adjusted under 35 U.S.C. 154(b) by 531 days.

(21) Appl. No.: 17/568,027

(22) Filed: Jan. 4, 2022

(65) Prior Publication Data

US 2022/0216059 A1 Jul. 7, 2022

Related U.S. Application Data

(60) Provisional application No. 63/134,825, filed on Jan. 7, 2021.

(51) Int. Cl.
| | |
|---|---|
| *H01L 21/285* | (2006.01) |
| *C23C 16/02* | (2006.01) |
| *C23C 16/455* | (2006.01) |
| *C23C 16/50* | (2006.01) |
| *C23C 16/52* | (2006.01) |
| *H01J 37/32* | (2006.01) |
| *H01L 21/02* | (2006.01) |

(52) U.S. Cl.
CPC .... *H01L 21/28556* (2013.01); *C23C 16/0272* (2013.01); *C23C 16/45536* (2013.01); *C23C 16/50* (2013.01); *C23C 16/52* (2013.01); *H01J 37/32449* (2013.01); *H01L 21/02164* (2013.01); *H01L 21/02183* (2013.01); *H01L 21/02186* (2013.01); *H01L 21/02252* (2013.01); *H01L 21/0228* (2013.01); *H01J 2237/332* (2013.01)

(58) Field of Classification Search
None
See application file for complete search history.

(56) References Cited

U.S. PATENT DOCUMENTS

| | | | |
|---|---|---|---|
| 8,901,016 B2 | 12/2014 | Ha | |
| 9,163,310 B2 | 10/2015 | Lee | |
| 2002/0000195 A1 | 1/2002 | Bang et al. | |
| 2008/0166887 A1* | 7/2008 | Lee | H01L 21/0276 257/E21.27 |
| 2012/0164846 A1* | 6/2012 | Ha | H01L 21/02153 257/E21.271 |
| 2012/0213945 A1* | 8/2012 | Lee | C23C 16/45534 427/255.393 |

(Continued)

*Primary Examiner* — Sue A Purvis
*Assistant Examiner* — Seyon Ali-Simah Punchbeddell
(74) *Attorney, Agent, or Firm* — Snell & Wilmer L.L.P.

(57) ABSTRACT

Methods and related systems for lithographically defining patterns on a substrate are disclosed. An exemplary method includes forming a structure. The method includes providing a substrate to a reaction chamber. The substrate comprises a semiconductor and a surface layer. The surface layer comprises amorphous carbon. The method further comprises forming a barrier layer on the surface layer and depositing a metal-containing layer on the substrate. The metal-containing layer comprises oxygen and a metal.

20 Claims, 12 Drawing Sheets

(56) References Cited

U.S. PATENT DOCUMENTS

| | | | |
|---|---|---|---|
| 2015/0340225 A1* | 11/2015 | Kim | C23C 16/455 |
| | | | 118/728 |
| 2017/0140925 A1* | 5/2017 | Suzuki | H01L 21/02126 |
| 2017/0352533 A1* | 12/2017 | Tois | H01L 21/76826 |
| 2018/0308695 A1* | 10/2018 | LaVoie | H01L 21/0338 |
| 2018/0337046 A1 | 11/2018 | Shamma et al. | |
| 2019/0088555 A1* | 3/2019 | Xie | H01L 29/495 |
| 2019/0103272 A1* | 4/2019 | Tsai | H01L 21/0214 |
| 2019/0172717 A1 | 6/2019 | Ko et al. | |
| 2021/0013037 A1 | 1/2021 | Sun | |
| 2021/0111025 A1 | 4/2021 | Zyulkov | |

* cited by examiner

METHOD OF FORMING A STRUCTURE AND SYSTEM FOR SAME

CROSS-REFERENCE TO RELATED APPLICATIONS

This application claims priority to U.S. Provisional Patent Application Ser. No. 63/134,825 filed Jan. 7, 2021 titled METHOD OF TREATING A SUBSTRATE, the disclosure of which is hereby incorporated by reference in its entirety.

FIELD OF INVENTION

The present disclosure generally relates to surface treatments, and particularly for surface treatments for forming structures. Furthermore, the disclosure relates to structures including a treated surface.

BACKGROUND OF THE DISCLOSURE

During the manufacture of electronic devices, fine patterns of features can be formed on a surface of a substrate by patterning the surface of the substrate and etching material from the substrate surface using, for example, gas-phase etching processes. As a density of devices on a substrate increases, it becomes increasingly desirable to form features with smaller dimensions. Thus, there is a need for improved methods for forming features having a small dimension on a substrate.

Any discussion of problems and solutions set forth in this section has been included in this disclosure solely for the purpose of providing a context for the present disclosure and should not be taken as an admission that any or all of the discussion was known at the time the invention was made.

SUMMARY OF THE DISCLOSURE

Various embodiments of the present disclosure relate to methods for treating a surface. While the ways in which various embodiments of the present disclosure address drawbacks of prior methods and structures are discussed in more detail below, in general, various embodiments of the disclosure can be used for improving various aspects of radiation-sensitive layers such as desired etch selectivity, low line width roughness (LWR), pattern quality (low number of defects and high pattern fidelity), compatibility with integration, and/or stability during EUV lithography processing—e.g., during any post-exposure bake (PEB).

In accordance with exemplary embodiments of the disclosure, described herein is a method of forming a structure. The method comprises, in the following order: providing a substrate to a reaction chamber, forming a barrier layer on the surface layer, and depositing a metal-containing layer on the substrate. The substrate comprises a semiconductor and a surface layer. The surface layer comprises amorphous carbon. The metal-containing layer comprises oxygen and a metal.

In some embodiments, forming the barrier layer on the surface layer comprises exposing the surface layer to a nitrogen-containing plasma. Accordingly, a plasma-modified surface layer is formed.

In some embodiments, forming the barrier layer on the surface layer comprises depositing an interlayer on the plasma-modified surface layer.

In some embodiments, forming the barrier layer on the surface layer comprises depositing an interlayer on the surface layer.

In some embodiments, forming the barrier layer on the surface layer further comprises exposing the interlayer to a nitrogen-containing plasma. Thus, a plasma-modified interlayer is formed.

In some embodiments, depositing the interlayer comprises a cyclical process comprising a plurality of subsequent cycles. A cycle comprises an interlayer precursor pulse and an interlayer reactant pulse. The interlayer precursor pulse comprises providing an interlayer precursor to the reaction chamber. The interlayer reactant pulse comprises providing an interlayer reactant to the reaction chamber.

In some embodiments, the interlayer precursor is selected from the list consisting of a silicon precursor, a titanium precursor, and a tantalum precursor.

In some embodiments, the interlayer reactant is an oxygen reactant.

In some embodiments, the oxygen reactant comprises a gaseous species selected from $O_2$, $O_3$, $H_2O$, $H_2O_2$, $N_2O$, NO, $CO_2$, CO, and $NO_2$.

In some embodiments, neither the step of providing an interlayer precursor to the reaction chamber nor step of providing an interlayer reactant to the reaction chamber comprises generating a plasma in the reaction chamber.

In some embodiments, the interlayer has a thickness of 3 nm or less.

In some embodiments, the method further comprises a step of depositing a photoresist layer on the metal-containing layer.

In some embodiments, the photoresist layer comprises an EUV photoresist.

In some embodiments, the step of depositing a metal-containing layer on the substrate comprises a cyclical deposition process comprising a plurality of subsequent cycles. A cycle comprises a metal-containing layer precursor pulse and a metal-containing layer reactant pulse.

In some embodiments, at least one of the metal-containing layer precursor pulse and the metal-containing layer reactant pulse is preceded by a purge.

In some embodiments, the metal-containing layer precursor pulse comprises providing a metal-containing precursor to the reaction chamber. The metal-containing precursor has a general formula $M[R(C_xH_y)n]_4$. M is selected from Ti, Ta, Hf, Zn, and Zr; R is selected from OCH and N; x is 1-2; y is 3-6; and n is 2-3.

In some embodiments, the metal-containing layer reactant pulse comprises providing a metal-containing layer reactant to the reaction chamber. Suitably, the metal-containing layer reactant can, in some embodiments, be selected from $H_2O$, $O_3$, and $H_2O_2$.

In some embodiments, the metal-containing layer reactant pulse comprises generating a plasma in the reaction chamber. The plasma is selected from a hydrogen-containing plasma and an oxygen-containing plasma.

In some embodiments, forming the barrier layer on the surface layer comprises exposing the substrate to radicals.

In some embodiments, the metal-containing layer has a thickness of less than 5 nm.

Further described herein is a system. The system comprises a reaction chamber; a gas injection system fluidly coupled to the reaction chamber; a first gas source for introducing a precursor and optionally a carrier gas into the reaction chamber; a second gas source for introducing a mixture of one or more further gasses into the reaction chamber; an exhaust; and a controller. The controller is configured to control gas flow into the gas injection system and for causing the system to carry out a method as described herein.

These and other embodiments will become readily apparent to those skilled in the art from the following detailed description of certain embodiments having reference to the attached figures; the invention not being limited to any particular embodiment(s) disclosed.

BRIEF DESCRIPTION OF THE FIGURES

A more complete understanding of exemplary embodiments of the present disclosure can be derived by referring to the detailed description and claims when considered in connection with the following illustrative figures.

Figure 1:
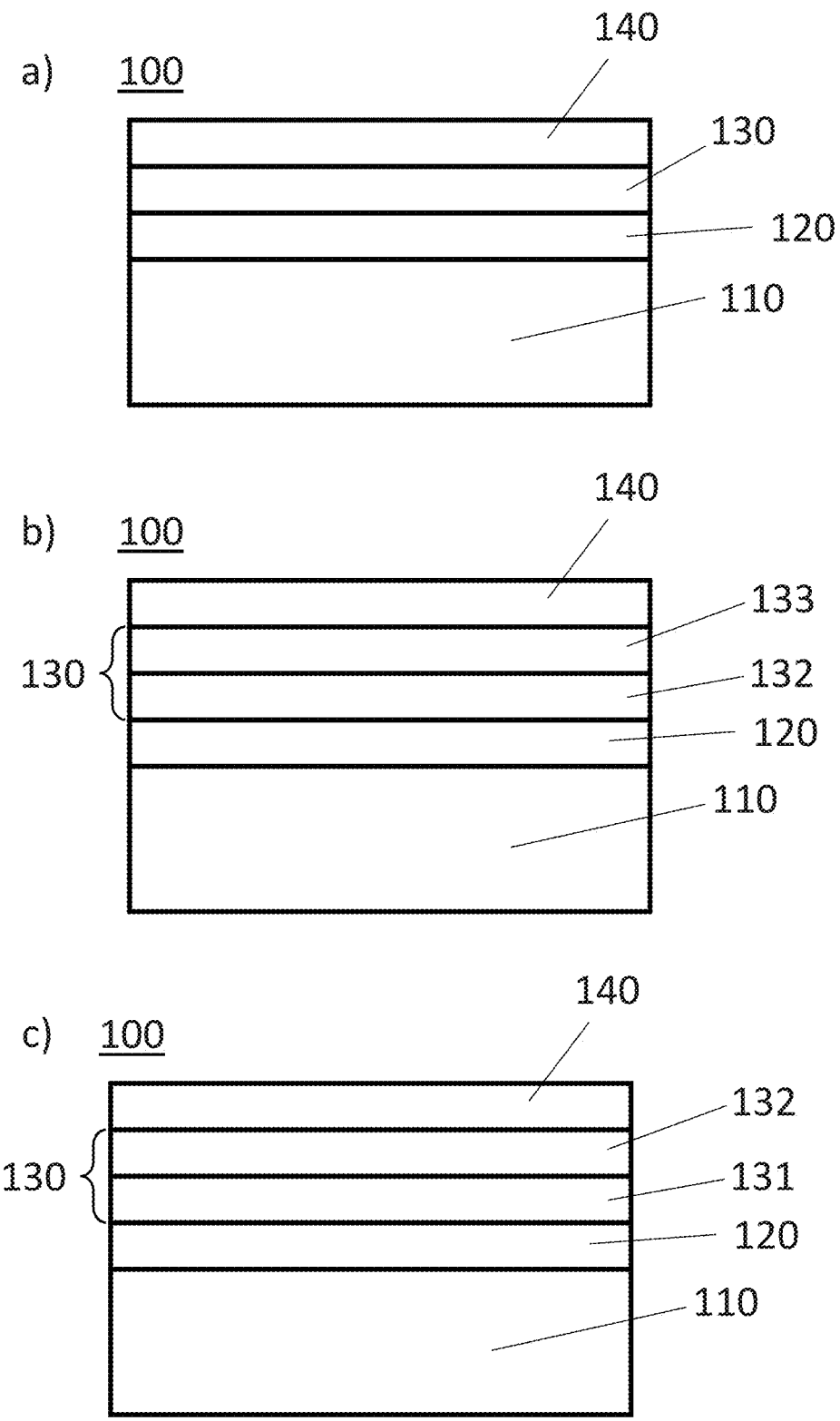
FIG. 1 illustrates several embodiments of structures formed according to a method as described herein.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood that the invention extends beyond the specifically disclosed embodiments and/or uses thereof and obvious modifications and equivalents thereof. Thus, it is intended that the scope of the invention disclosed should not be limited by the particular disclosed embodiments described below.

As used herein, the term "substrate" may refer to any underlying material or materials including and/or upon which one or more layers can be deposited. A substrate can include a bulk material, such as silicon (e.g., single-crystal silicon), other Group IV materials, such as germanium, or compound semiconductor materials, such as GaAs, and can include one or more layers overlying or underlying the bulk material. For example, a substrate can include a patterning stack of several layers overlying bulk material. The patterning stack can vary according to application. Further, the substrate can additionally or alternatively include various features, such as recesses, lines, and the like formed within or on at least a portion of a layer of the substrate.

In some embodiments, "film" refers to a layer extending in a direction perpendicular to a thickness direction. In some embodiments, "layer" refers to a material having a certain thickness formed on a surface or a synonym of film or a non-film structure. A film or layer may be constituted by a discrete single film or layer having certain characteristics or multiple films or layers, and a boundary between adjacent films or layers may or may not be clear and may or may not be established based on physical, chemical, and/or any other characteristics, formation processes or sequence, and/or functions or purposes of the adjacent films or layers. Further, a layer or film can be continuous or discontinuous.

In this disclosure, "gas" may include material that is a gas at normal temperature and pressure, a vaporized solid and/or a vaporized liquid, and may be constituted by a single gas or a mixture of gases, depending on the context. A gas other than the process gas, i.e., a gas introduced without passing through a gas distribution assembly, such as a showerhead, other gas distribution device, or the like, may be used for, e.g., sealing the reaction space, and may include a seal gas, such as a noble gas.

In some cases, such as in the context of deposition of material, the term "precursor" can refer to a compound that participates in the chemical reaction that produces another compound, and particularly to a compound that constitutes a film matrix or a main skeleton of a film, whereas the term "reactant" can refer to a compound, in some cases other than precursors, that activates a precursor, modifies a precursor, or catalyzes a reaction of a precursor; a reactant may provide an element (such as O, N, C) to a film matrix and become a part of the film matrix. In some cases, the terms precursor and reactant can be used interchangeably.

It shall be understood that the term "metal-containing layer precursor" refers to a precursor which is used during deposition of a metal-containing layer. Similarly, the term "metal-containing layer reactant" refers to a reactant which is used during deposition of the metal-containing layer.

The term "cyclic deposition process" or "cyclical deposition process" may refer to the sequential introduction of precursors (and/or reactants) into a reaction chamber to deposit a layer over a substrate and includes processing techniques such as atomic layer deposition (ALD), cyclical chemical vapor deposition (cyclical CVD), and hybrid cyclical deposition processes that include an ALD component and a cyclical CVD component.

The term "atomic layer deposition" may refer to a vapor deposition process in which deposition cycles, typically a plurality of consecutive deposition cycles, are conducted in a process chamber. The term atomic layer deposition, as used herein, is also meant to include processes designated by related terms, such as chemical vapor atomic layer deposition, atomic layer epitaxy (ALE), molecular beam epitaxy (MBE), gas source MBE, or organometallic MBE, and chemical beam epitaxy when performed with alternating pulses of precursor(s)/reactive gas(es), and purge (e.g., inert carrier) gas(es).

Generally, for ALD processes, during each cycle, a precursor is introduced to a reaction chamber and is chemisorbed to a deposition surface (e.g., a substrate surface that can include a previously deposited material from a previous ALD cycle or other material), forming about a monolayer or sub-monolayer of material that does not readily react with additional precursor (i.e., a self-limiting reaction). Thereafter, in some cases, a reactant (e.g., another precursor or reaction gas) may subsequently be introduced into the process chamber for use in converting the chemisorbed precursor to the desired material on the deposition surface. The reactant can be capable of further reaction with the precursor. Purging steps can be utilized during one or more cycles, e.g., during each step of each cycle, to remove any excess precursor from the process chamber and/or remove any excess reactant and/or reaction byproducts from the reaction chamber.

In this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, etc. in some embodiments. Further, in this disclosure, the terms "including," "constituted by" and "having" can refer independently to "typically or broadly comprising," "comprising," "consisting essentially of," or "consisting of" in some embodiments. In accordance with aspects of the disclosure, any defined meanings of terms do not necessarily exclude ordinary and customary meanings of the terms.

Described herein is a method of forming a structure. The method comprises, in the following order: 1) providing a substrate comprising a surface layer to a reaction chamber, 2) forming a barrier layer on the surface layer, and 3) depositing a metal-containing layer on the substrate.

In some embodiments, the surface layer comprises silicon, oxygen, and carbon. In some embodiments, the surface layer comprises a carbon-containing material. In some embodiments, the surface layer comprises a material selected from amorphous carbon, silicon oxycarbide (SiOC), and silicon carbonitride (SICN). In some embodiments, the surface layer comprises amorphous carbon. In some embodiments, the surface layer has a carbon content which is higher than 80 atomic %, or which is higher than 90 atomic %, or which is higher than 95 atomic %, or which is higher than 99 atomic %. In some embodiments, the surface layer substantially consists of carbon.

As used herein, unless stated otherwise, SiOC is not intended to limit, restrict, or define the bonding or chemical state, for example, the oxidation state of any of Si, O, C, and/or any other element in the film. Further, in some embodiments, SiOC thin films may comprise one or more elements in addition to Si, O, and/or C, such as H or N.

As used herein, unless stated otherwise, SiCN is not intended to limit, restrict, or define the bonding or chemical state, for example, the oxidation state of any of Si, C, N, and/or any other element in the film. Further, in some embodiments, SiCN thin films may comprise one or more elements in addition to Si, C, and N, such as H.

In some embodiments, the presently described methods comprise depositing the surface layer on the substrate. In some embodiments, the surface layer is deposited by means of a chemical vapor deposition method in which precursors and reactants are continuously provided to the reaction chamber. In some embodiments, the surface layer is deposited by means of a cyclical deposition process, such as an ALD process. For example, depositing the surface layer can include pulsing a carbon precursor to a reaction chamber, allowing the carbon precursor to react with a surface of a substrate, and purging any unreacted precursor and/or byproducts. In some embodiments, the surface layer has a thickness of at most 3 nm, for example a thickness of at least 1 nm to at most 2 nm.

In some embodiments, forming a barrier layer on the surface layer comprises exposing the substrate to radicals. The radicals can, for example be generated in a remote plasma such as a remote hydrogen plasma, a remote nitrogen plasma, a remote oxygen plasma, or a remote noble gas plasma. Exemplary noble gasses include He, Ne, Ar, Kr, and Xe. Accordingly, a method as described herein can comprise forming a barrier layer by exposing the substrate to one or more of hydrogen radicals, nitrogen radicals, oxygen radicals, and noble gas radicals such as He radicals, Ne radicals, Ar radicals, Kr radicals, and Xe radicals. Such radical exposures can advantageously improve nucleation on amorphous-carbon-containing surface layers, such as C—H terminated amorphous carbon layers, without damaging them.

In some embodiments, forming a barrier layer on the surface layer comprises at least one of exposing the substrate to a nitrogen-containing plasma and depositing an interlayer on the substrate. Advantageously, forming a barrier layer on the surface layer results in suppression of intermixing between the metal-containing layer and the surface layer. Indeed, in prior art techniques, metal-containing layers can be deposited by means of relatively reactive plasma process techniques such as plasma-enhanced atomic layer deposition (PEALD) or plasma-enhanced chemical vapor deposition (PECVD) processes employing an $O_2$ or $H_2$ plasma. Such plasma-based deposition processes can interact with carbon-containing surface layers such as amorphous carbon to form volatile by products such as gasses comprising carbon and at least one of oxygen and hydrogen. Thus, such plasma-based deposition processes can result in a reduction of thickness of such surface layers and/or can result in surface roughening. In addition, thickness variations across a substrate surface can result. Additionally or alternatively, a carbon concentration gradient may result in a metal-containing layer deposited on the surface layer. In the present methods, a barrier layer advantageously protects the carbon-containing surface layer, thus reducing surface roughness and carbon incorporation in the metal-containing layer.

In some embodiments, forming the barrier layer on the surface layer comprises exposing the surface layer to a nitrogen-containing plasma. Accordingly, a plasma-modified surface layer is formed. In other words, part of the surface layer can be converted into a barrier layer by exposing the substrate to a nitrogen-containing plasma. While exposing the substrate to a nitrogen-containing plasma gas, a nitrogen-containing gas or gas mixture can be used as a plasma gas. Suitable nitrogen-containing gasses or gas mixtures comprise at least one of $N_2$, $NH_3$, and $N_2O$.

In some embodiments, exposing the substrate to a nitrogen-containing plasma comprises exposing the substrate to a direct nitrogen-containing plasma.

In some embodiments, forming the barrier layer on the surface layer comprises exposing the surface layer to nitrogen radicals. The nitrogen radicals may, for example, be generated by means of a remote plasma such as an inductively coupled plasma. In other embodiments, the radicals may, for example, be generated by means of a hot wire source.

In some embodiments, forming the barrier layer on the surface layer comprises exposing the surface layer to one or more nitrogen-containing agents, i.e. one or more nitrogen-containing molecules, radicals, or ions. Exemplary nitrogen-containing agents can include a chemical formula that includes N, and optionally one or more of C, O, and H. In some embodiments, forming the barrier layer on the surface layer comprises exposing the surface layer to a plasma which is generated in the reaction chamber. Suitably, a plasma gas is used that comprises a nitrogen-containing agents can include a chemical formula that includes N, and optionally one or more of C, O, and H.

In some embodiments, forming the barrier layer on the surface layer comprises depositing an interlayer on the surface layer. Depositing the interlayer can, in some embodiments, comprise employing a cyclical process. The cyclical deposition process comprises one or a plurality of subsequent cycles. A cycle comprises a barrier precursor pulse and a barrier reactant pulse. A barrier precursor pulse comprises providing a barrier precursor to the reaction chamber. A barrier reactant pulse comprises providing a barrier reactant to the reaction chamber. In some embodiments, the barrier precursor pulse and the barrier reactant pulse are separated by a purge. In some embodiment, subsequent cycles are separated by a purge. During a purge, the reaction chamber is advantageously evacuated or filled with a process gas, e.g. with a noble gas such as argon.

In some embodiments, forming the barrier layer on the surface layer comprises a thermal process, such as a thermal atomic layer deposition process or a thermal chemical vapor deposition process. In other words, and in some embodiments, forming the barrier layer on the surface layer does not employ a plasma.

The barrier precursor can, in some embodiments, be selected from the list consisting of a silicon precursor, a titanium precursor, and a tantalum precursor.

Depositing the interlayer can, in some embodiments, comprise employing a radical-enhanced cyclical process. Such radical-enhanced cyclical deposition processes can advantageously improve nucleation on amorphous-carbon-containing surface layers, such as C—H terminated amorphous carbon layers, without damaging them. The radical-enhanced cyclical deposition process comprises one or a plurality of subsequent cycles. A cycle comprises a barrier precursor pulse and a barrier reactant pulse. A barrier precursor pulse comprises providing a barrier precursor to the reaction chamber. A barrier reactant pulse comprises providing a barrier reactant to the reaction chamber. At least one of the barrier precursor pulse and the barrier reactant pulse comprises exposing the substrate to radicals. In some embodiments, the barrier precursor comprises radicals. In some embodiments, the barrier reactant comprises radicals. In some embodiments, the barrier precursor pulse and the barrier reactant pulse are separated by a purge. In some embodiment, subsequent cycles are separated by a purge. During a purge, the reaction chamber is advantageously evacuated or filled with a process gas, e.g. with a noble gas such as argon.

The barrier precursor can, in some embodiments, be selected from the list consisting of a silicon precursor, a titanium precursor, and a tantalum precursor.

In some embodiments, the barrier precursor pulse comprises exposing the substrate to a barrier precursor without exposing the substrate to radicals, and the barrier reactant pulse comprises exposing the substrate to a barrier reactant that contains radicals. Suitable radicals include hydrogen radicals, oxygen radicals, nitrogen radicals, and noble gas radicals such as He radicals, Ne radicals, Ar radicals, Kr radicals, and Xe radicals.

In some embodiments, the silicon precursor comprises an alkylaminosilane. Suitable alkylaminosilanes include bis(diethylamino)silane and diisopropylamino silane.

In some embodiments, the silicon precursor comprises an alkoxysilane. Suitable alkoxysilanes include dimethyldimethoxysilane, (3-methoxypropyl)trimethoxysilane.

In some embodiments, the silicon precursor comprises an alkoxysiloxane. Suitable alkoxysiloxanes include 1,3-Dimethoxytetramethyldisiloxane.

In some embodiments, the silicon precursor comprises an alkyl- and alkoxy-substituted siloxane such as 1,3-Dimethoxytetramethyldisiloxane.

In some embodiments, the silicon precursor comprises an alkyl-substituted cyclosiloxane such as octamethylcyclotetrasiloxane.

In some embodiments, the silicon precursor comprises an alkoxysilyl-substituted alkane such as 1,2-bis(triethoxysilyl)ethane.

In some embodiments, the silicon precursor comprises a silane comprising an aminoalkyl group and an alkoxy group such as 3-aminopropyltrimethoxysilane.

In some embodiments, the titanium precursor comprises at least one alkoxy ligand. An exemplary titanium precursor includes titanium tetraisopropoxide.

In some embodiments, the titanium precursor comprises one or more alkylamine ligands. A suitable titanium precursor includes tetrakis(dimethylamido)titanium(IV).

In some embodiments, the tantalum precursor comprises one or more alkylamine ligands. A suitable tantalum precursor includes pentakis(dimethylamino)tantalum(V).

The barrier reactant can, in some embodiments, comprise or be an oxygen reactant. Exemplary oxygen reactants include oxygen-containing gasses such as $O_2$, $O_3$, oxygen radicals, oxygen ions, or gas mixtures such as mixtures of nitrogen and oxygen, mixtures of nitrogen and ozone, mixtures of a noble gas and oxygen, and mixtures of a noble gas and ozone. In some embodiments, the oxygen reactant comprises a gaseous species selected from $O_2$, $O_3$, $H_2O$, $H_2O_2$, $CO_2$, $CO$, $N_2O$, $NO$, and $NO_2$.

In some embodiments, the barrier precursor can be selected from a silicon precursor and a metal precursor. In some embodiments, the barrier precursor can be selected from a silicon precursor, a tantalum precursor, a hafnium precursor, a tin precursor, a titanium precursor, an aluminum precursor, and a zinc precursor. Such barrier precursors can be used together with an oxygen reactant as described herein. Additionally or alternatively, such precursors can be used together with a reactant containing one or more of oxygen, nitrogen, and carbon. Thus, in some embodiments, the barrier layer comprises an oxynitride, a carbonitride, or an oxycarbonitride of one or more selected from Si, Ta, Hf, Sn, Ti, Al, and Zn.

In some embodiments, forming the barrier layer comprises using a barrier precursor selected from a silicon precursor, a titanium precursor, and a tantalum precursor. Thus, a barrier layer comprising one or more of silicon, titanium, and tantalum can be formed. Advantageously, silicon, titanium, and tantalum can form volatile by products when exposed to a fluorine-containing chemical or plasma. Thus, barrier layers comprising one or more of silicon, titanium, and tantalum can be easily etched using common etching chemistries.

In some embodiments, the barrier precursor contains an alkoxide ligand. In some embodiments, the barrier precursor comprises a C1 to C4 alkoxide ligand. In some embodiments, the barrier precursor comprises an isopropoxide ligand. In some embodiments, the barrier precursor is selected from silicon isopropoxide, titanium isopropoxide, and tantalum isopropoxide.

In some embodiments, the barrier precursor has a general formula $M[R(C_xH_y)_n]_4$, where M is selected from Ti, Ta, Hf, Zn, and Zr; and R is selected from OCH and N, wherein x is 1-2, wherein y is 3-6, and wherein n is 2-3.

In some embodiments, neither the step of providing a barrier precursor to the reaction chamber nor step of providing a barrier reactant to the reaction chamber comprises generating a plasma in the reaction chamber. In other words, and in some embodiments, the step of depositing the interlayer employs a thermal process. This can advantageously improve the interlayer's properties, e.g. by reducing or entirely avoiding intermixing between the surface layer and the interlayer.

In some embodiments, at least one of the step of providing a barrier precursor to the reaction chamber and the step of providing a barrier reactant to the reaction chamber comprises providing radicals to the reaction chamber. The radicals may, for example, be generated by means of a remote plasma such as an inductively coupled plasma. In other embodiments, the radicals may, for example, be generated by means of a hot wire source.

In some embodiments, at least one of the step of providing a barrier precursor to the reaction chamber and the step of providing a barrier reactant to the reaction chamber comprises generating a plasma in the reaction chamber.

In some embodiments, the barrier precursor and the barrier reactant are simultaneously provided to the reaction chamber. In some embodiments, a plasma is generated in the reaction chamber while simultaneously providing the barrier precursor and the barrier reactant to the reaction chamber. In some embodiments, no plasma is generated in the reaction chamber while simultaneously providing the barrier precursor and the barrier reactant to the reaction chamber.

In case a plasma is generated in the reaction chamber during deposition of the barrier layer, "soft" plasma conditions are advantageously used in order to minimize thickness reduction of the carbon-containing surface layer and to minimize surface roughening. In particular, a low plasma power can, in some embodiments, be advantageously used, such as a plasma power of at least 30 W to at most 100 W. It shall be understood that these powers apply when the substrate is a 300 mm semiconductor wafer. A skilled artisan can easily transfer these powers to other substrate sizes, if desired. Additionally or alternatively, the plasma gas can, in some embodiments, comprise a noble gas such as He, Ne, Ar, Kr, or Xe. In some embodiments, the plasma gas comprises Ar. In some embodiments, the plasma gas essentially consists of a noble gas. In some embodiments, the plasma gas essentially consists of Ar. Additionally or alternatively, a relatively short plasma exposure time can be used, such as a plasma exposure time of at least 0.01 s to at most 1.0 s, or of at least 0.01 s to at most 0.1 s, or of at least 0.1 s to at most 1.0 s. When a cyclic deposition process is used, the above-mentioned times can, in some embodiments, advantageously refer to the total plasma on time during deposition of the barrier layer. Additionally or alternatively, and in some embodiments, a relatively high pressure can be used during the deposition of the barrier layer, such as a pressure of at least 100 Torr to at most 760 Torr.

In some embodiments, a plasma generated in the reaction chamber during deposition of the barrier layer can be an RF plasma. In some embodiments, the RF plasma can be generated by means of a power waveform having a fundamental frequency of at least 20 MHz to at most 200 MHz. Doing so can advantageously reduce surface roughness.

In some embodiments, a microwave plasma is generated in the reaction chamber during deposition of the barrier layer. Doing so can advantageously reduce surface roughness.

In some embodiments, vacuum ultraviolet light is used for generating a plasma in the reaction chamber during deposition of the barrier layer. Advantageously, such a vacuum ultraviolet light generated plasma can be kept on for a relatively short duration, e.g. for at least 0.01 µs to at most 100 µs, or for at least 0.1 µs to at most 10 µs, or for at least 0.2 µs to at most 5 µs, or for at least 0.5 µs to at most 2 µs. When a cyclic deposition process is used, the above-mentioned times can, in some embodiments, advantageously refer to the time the vacuum ultraviolet light is on during deposition of the barrier layer.

In some embodiments, forming the barrier layer on the surface layer further comprises depositing an interlayer on the surface layer, and then exposing the interlayer to a nitrogen-containing plasma, thus forming a plasma-modified interlayer.

In some embodiments, forming the barrier layer on the surface layer comprises exposing the surface layer to a nitrogen-containing plasma to form a plasma-modified surface layer, and then depositing an interlayer on the plasma-modified surface layer.

In some embodiments, forming the barrier layer on the surface layer comprises exposing the surface layer to a nitrogen-containing plasma to form a plasma-modified surface layer, then depositing an interlayer on the plasma-modified surface layer, and then exposing the interlayer to a nitrogen-containing plasma, thus forming a plasma-modified interlayer.

In some embodiments, the metal-containing layer is a layer which, in a patterning stack, is positioned between a carbon-containing layer such as an amorphous carbon layer and a photoresist layer. Suitable metal-containing layers provide etch contrast with respect to a carbon-containing layer, and provide suitable adhesion to photoresist layers. Alternatively, a metal-containing layer can be named an etch contrast layer, a separator layer, a patterning aid layer, or simply a layer. In some embodiments, the photoresist layer comprises a metal and oxygen. In some embodiments, the metal-containing layer comprises one or more of a metal oxide, a metal nitride, and a metal oxynitride. Using a barrier layer and a metal-containing layer between the surface layer and the photoresist can advantageously result in improved patterning quality, e.g. by reducing or eliminating the occurrence of stochastic effects such as micro-bridges, and micro-breaks. It shall be understood that the reaction conditions under which the barrier layer is deposited and the reaction conditions under which the metal-containing layer is deposited are different.

The metal-containing layer can, in some embodiments, have a thickness of 5 nm or less, or a thickness of 3 nm or less. In some embodiments, the metal-containing layer has a thickness of at least 0.3 nm to at most 3.0 nm, or a thickness of at least 0.3 nm to at most 0.5 nm, or a thickness of at least 0.5 nm to at most 1.0 nm, or a thickness of at least 1.0 nm to at most 1.5 nm, or a thickness of at least 1.5 nm to at most 2.0 nm, or a thickness of at least 2.0 nm to at most 2.5 nm, or a thickness of at least 2.5 nm to at most 3.0 nm.

In some embodiments, the step of depositing a metal-containing layer comprises a cyclical deposition process comprising a plurality of subsequent cycles. A cycle in this cyclical deposition process comprises a metal-containing layer precursor pulse and a metal-containing layer reactant pulse. In some embodiments, the metal-containing layer precursor pulse and the metal-containing layer reactant pulse are separated by an intra-cycle purge. In some embodiments, subsequent cycles are separated by an intra-cycle purge. Thus, and in some embodiments, at least one of the metal-containing layer precursor pulse and the metal-containing layer reactant pulse is preceded by a purge.

In some embodiments, forming the metal-containing layer comprises a plasma-enhanced atomic layer deposition (PEALD) process comprising one or more cycles. A cycle comprises providing a exposing a substrate to a metal-containing layer precursor; purging excess precursor from the reaction chamber; exposing the substrate to a noble gas plasma comprising reactive species; and, purging excess reactive species from the reaction chamber.

In some embodiments, the metal-containing layer precursor pulse comprises providing a metal-containing precursor to the reaction chamber, the metal-containing precursor having a general formula $M[R(C_xH_y)_n]_4$, where M is selected from Ti, Ta, Hf, Zn, and Zr, wherein R is selected from OCH and N, wherein x is 1-2, wherein y is 3-6, and wherein n is 2-3.

In some embodiments, the metal-containing layer reactant pulse comprises providing a metal-containing layer reactant to the reaction chamber. Suitably, the metal-containing layer reactant can be selected from $H_2O$, $O_3$, and $H_2O_2$. Additionally or alternatively, the metal-containing layer reactant pulse can comprise generating a plasma in the reaction chamber. In some embodiments, the plasma can be selected from a hydrogen-containing plasma and an oxygen-containing plasma. Suitable hydrogen-containing plasmas include plasmas that employ a plasma gas comprising at least one of $H_2O$, $H_2O_2$, and $H_2$. Suitable oxygen-containing plasmas include plasmas that employ a plasma gas comprising at least one of $O_2$, $O_3$, $H_2O$, and $H_2O_2$. It shall be understood that some plasmas, e.g. plasmas employing a plasma gas comprising at least one of $H_2O$ and $H_2O_2$, can be classified both as an oxygen-containing plasma and a hydrogen-containing plasma.

In some embodiments, the metal-containing layer reactant comprises at least one of oxygen and nitrogen. In some embodiments, the metal-containing layer reactant comprises both nitrogen and oxygen. Exemplary metal-containing layer reactants include oxygen ($O_2$), water ($H_2O$), ozone ($O_3$), hydrogen peroxide ($H_2O_2$), $NH_3$, diazene ($N_2H_2$), and the like.

In some embodiments, the metal-containing layer is deposited by means of a thermal ALD or a thermal CVD method. In some embodiments, the metal-containing layer reactant is selected from $H_2O$, $O_3$, and $H_2O_2$.

In some embodiments, the metal-containing layer is deposited by means of a plasma ALD or plasma pulsed-CVD method. Thus, depositing the metal-containing layer can, in some embodiments, comprise exposing a substrate to a plasma pulse. Suitably a plasma pulse may comprise generating a plasma in a reaction chamber. The plasma can be selected from a plasma employing a plasma gas comprising Hz, a plasma employing a plasma gas comprising $H_2$ and He, a plasma employing a plasma gas comprising $H_2$ and Ar, a plasma employing a plasma gas comprising Ar, and a plasma employing a plasma gas comprising $O_2$. Thus a thin metal-containing layer having excellent uniformity may be formed.

In some embodiments, the metal-containing layer comprises carbon. For example, the metal-containing layer can comprise from at least 5 at % to at most 30 at % carbon. In some cases, a concentration of carbon in the metal-containing layer can vary with a height of the metal-containing layer—e.g., a concentration of carbon near a top surface of the metal-containing layer (e.g., in the top 1-2 nm) may be greater than the concentration of carbon in the lower or bulk of the metal-containing layer. In such embodiments, a concentration of carbon in the top surface of the metal-containing layer can be greater by at least 10 at % to at most 50 at % carbon.

In some embodiments, a carbon precursor is provided to the reaction chamber during the step of forming the metal-containing layer. The carbon precursor can include any suitable organic compound, such as compounds comprising carbon and oxygen. In some cases, the carbon precursor can also include nitrogen. The carbon precursor can be selected to react with, for example an —OH terminated surface of metal oxides and/or a —$NH_2$ terminated surface of a metal nitride. In some embodiments, the carbon precursor comprises one or more of an organic a carboxylic acid anhydrate, toluene, diethylene glycol, triethylene glycol, acetaldehyde, and organosilicon compounds, such as silane and siloxanes. Examples of suitable carbon precursors include one or more of organic compounds, such as acid anhydrate (e.g., acetic anhydrate), toluene, diethylene glycol, triethylene glycol, acetaldehyde, and organosilicon compounds, such as silanes, and siloxanes. Exemplary organosilicon compounds include (n,n-dimethylamino)trimethylsilane, trimethoxy(octadecyl)silane, hexamethyldisilazane, trimethoxy(3,3,3-trifluoropropyl)silane, trimethoxyphenylsilane, trichloro(3,3,3-trifluoropropyl)silane and hexamethyldisilazane. In some embodiments, the carbon precursor comprises an organosilicon compound selected from the group consisting of (n,n-dimethylamino)trimethylsilane, trimethoxy(octadecyl)silane, trimethoxyphenylsilane, trichloro(3,3,3-trifluoropropyl)silane and hexamethyldisilazane.

In some embodiments, the metal-containing precursor is titanium(IV) isopropoxide.

In some embodiments, the metal-containing layer comprises Hf, and the metal-containing layer is deposited using a precursor selected from tetrakis(ethylmethylamido)hafnium, dimethylbis(cyclopentadienyl)hafnium, and hafnium(IV) tert-butoxide.

In some embodiments, the metal-containing layer comprises Ta, and the metal-containing layer is deposited using a precursor selected from pentakis(dimethylamino)tantalum, tantalum(V)ethoxide, tris(diethylamido)(tert-butylimido) tantalum, Tris(ethylmethylamido)(tert-butylimido)tantalum, tantalum tetraethoxy dimethylaminoethoxide, and tert-Butylimidotris(diethylamido)tantalum.

In some embodiments, the metal-containing layer is formed at a temperature of at least 70° C. to at most 300° C., or at a temperature of at least 70° C. to at most 120° C., or at a temperature of at least 120° C. to at most 170° C., or at a temperature of at least 170° C. to at most 220° C., or at a temperature of at least 220° C. to at most 300° C.

In some embodiments, forming the metal-containing layer comprises the formation of a lower metal-containing layer part and an upper metal-containing layer part.

In some embodiments, the lower metal-containing layer part is formed using a metal halogenide precursor.

In some embodiments, the lower metal-containing layer part is formed using a metal-containing precursor having a general formula $M[R(C_xH_y)_n]_4$, where M is selected from Ti, Ta, Hf, Zn, and Zr, wherein R is selected from OCH and N, wherein x is 1-2, wherein y is 3-6, and wherein n is 2-3.

In some embodiments, the upper metal-containing layer part is formed using a metal-containing precursor having a general formula $M[R(C_xH_y)_n]_4$, where M is selected from Ti, Ta, Hf, Zn, and Zr, wherein R is selected from OCH and N, wherein x is 1-2, wherein y is 3-6, and wherein n is 2-3.

In some embodiments, the upper metal-containing layer part is formed using a plasma-enhanced atomic layer deposition process or a plasma-enhanced chemical vapor deposition process in which a noble gas is used as a plasma gas. In some embodiments, the noble gas comprises Ar.

In some embodiments, the upper metal-containing layer part comprises silicon, oxide, and carbon, the upper metal-containing layer part has a thickness of from at least 0.1 nm to at most 2.0 nm, and the upper metal-containing layer part is formed using a cyclical deposition process comprising a plurality of cycles, a cycle comprising a precursor pulse and a reactant pulse. In some embodiments, the precursor pulse comprises providing an organosilicon precursor to the reaction chamber and the reactant pulse comprises providing an oxygen-containing reactant selected from $O_2$, $H_2O$, $O_2$, and $H_2O_2$ to the reaction chamber. Optionally, the precursor pulse and the reactant pulse are separated by a purge. Optionally, subsequent cycles are separated by a purge.

In some embodiments, forming the metal-containing layer comprises a plasma-enhanced atomic layer deposition (PEALD) process comprising one or more cycles, the cycles comprising: providing a substrate to a reaction chamber; exposing the substrate to one or more precursors; purging excess precursor from the reaction chamber; exposing the substrate to a noble gas plasma, the noble gas plasma comprising reactive species; and, purging excess reactive species from the reaction chamber.

In some embodiments, the lower metal-containing layer part has a laminar structure comprising alternating silicon containing lamellae and metal containing lamellae. Such a structure can be obtained, for example, by employing a cyclical deposition process comprising a plurality of super cycles. A super cycle comprises one or more subsequent silicon sub cycles and one or more subsequent metal sub-cycles. A silicon sub-cycle comprises providing a precursor pulse in which a silicon precursor is provided to the reaction chamber and a reactant pulse in which a suitable reactant is provided to the reaction chamber. A metal sub-cycle comprises providing a precursor pulse in which a metal precursor is provided to the reaction chamber and a reactant pulse in which a suitable reactant is provided to the reaction chamber. Optionally, one or more of the reactant pulses comprises generating a plasma in the reaction chamber. In some embodiments, the silicon precursor is selected from aminosilanes, alkylsilanes, alkoxysilanes, and silicon halides. In some embodiments, the metal precursor has a general formula $M[R(C_xH_y)_n]_4$, where M is selected from Ti, Ta, Hf, Zn, and Zr, wherein R is selected from OCH and N, wherein x is 1-2, wherein y is 3-6, and wherein n is 2-3.

In some embodiments, the method further comprises a step of depositing a photoresist layer on the metal-containing layer. Methods for depositing a photoresist layer as such are known in the art. For example, the photoresist can be deposited using spin-on coating, or using a vapor phase deposition process. The photoresist layer can be or can include positive or negative tone extreme ultraviolet (EUV) lithography photoresist.

Further described herein is a system. The system comprises a reaction chamber and a gas injection system fluidly coupled to the reaction chamber. The system further comprises a first gas source for introducing a precursor and optionally a carrier gas into the reaction chamber. The system further comprises a second gas source for introducing a mixture of one or more further gasses into the reaction chamber. The system further comprises an exhaust and a controller. The controller is configured to control gas flow into the gas injection system. The controller is further configured for causing the system to carry out a method as described herein.

FIG. 1 illustrates several embodiments of structures (100) formed according to a method as described herein. In particular, FIG. 1 comprises three panels: panel a), panel b), and panel c). Panel a) describes a structure (100) comprising a surface layer (120) on a substrate (110). A barrier layer (130) has been formed on the surface layer (120). In some embodiments, the barrier layer (130) comprises a plasma-modified surface layer. Additionally or alternatively, the barrier layer (130) can comprise an interlayer (132). A metal-containing layer (140) covers the barrier layer (130). FIG. 1, panel b) shows another structure (100). It is similar to the structure (100) shown in panel a), except that in the structure (100) of panel b), the barrier layer (130) comprises a plasma-modified surface layer (131) and an interlayer (132) overlying the plasma-modified surface layer (131). FIG. 1 panel c) shows another structure (100). It is similar to the structure (100) shown in panel a), except that in the structure (100) of panel c), the barrier layer (130) comprises an interlayer (132) and a plasma-modified interlayer (133) overlying the interlayer (132).

Figure 2:
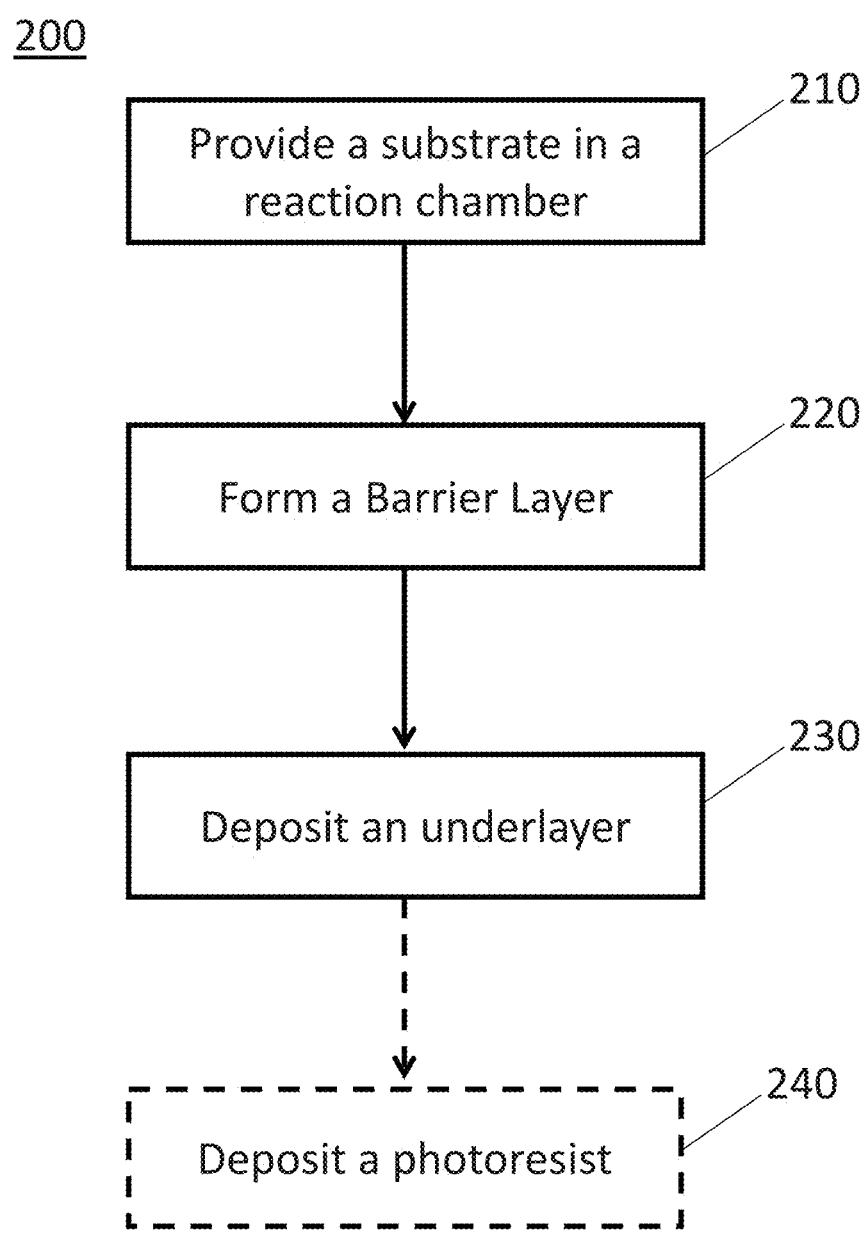
FIG. 2 shows an embodiment of a method (200) of forming a structure as described herein.

FIG. 2 shows an embodiment of a method (200) of forming a structure as described herein. The method (200) comprises a step (210) of providing a substrate to a reaction chamber. The substrate can include one or more layers, including one or more material layers, to be etched. By way of examples, the substrate can include a deposited oxide, a native oxide, or a semiconductor bulk to be etched. Optionally, substrate can include several layers underlying the material layer(s) to be etched. The substrate further comprises a surface layer comprising amorphous carbon. The method further comprises a step (220) of forming a barrier layer on the surface layer. Then, the method comprises a step (230) of depositing a metal-containing layer on the substrate. It shall be understood that the metal-containing layer comprises oxygen and a metal. Optionally, the method comprises a step (240) of depositing a photoresist on the metal-containing layer. In accordance with exemplary aspects of the method (200), the metal-containing layer can be formed using a cyclical deposition process, such as an ALD process. The cyclical deposition process can include use of activated species (e.g., formed from one or more of precursor(s) reactant(s), or and/or inert gas(es)) that are formed using one or more of a direct plasma and a remote plasma. Alternatively, the metal-containing layer can be deposited by means of a thermal cyclical deposition process. Use of cyclical deposition processes may be desirable, because they allow for the formation of a metal-containing layer with desired thickness—e.g., less than 10 nm or less than or about equal to 5 nm, with improved thickness uniformity—both within a substrate and from substrate-to-substrate. Using a plasma-enhanced process may be desirable, because plasma-enhanced processes allow for deposition of the metal-containing layer material at relatively low temperatures. In accordance with examples of the disclosure, a temperature within the reaction chamber can be from at least 100° C. to at most 500° C. during at least one of the step (220) of forming a barrier layer and the step (230) of depositing an under layer. In some embodiments, the pressure within the reaction chamber during at least one of the step (220) of forming a barrier layer and the step (230) of depositing a metal-containing layer can be from at least 1 Torr to at most 100 Torr, or from at least 3 Torr to at most 50 Torr, or from at least 5 Torr to at most 20 Torr.

Figure 3:
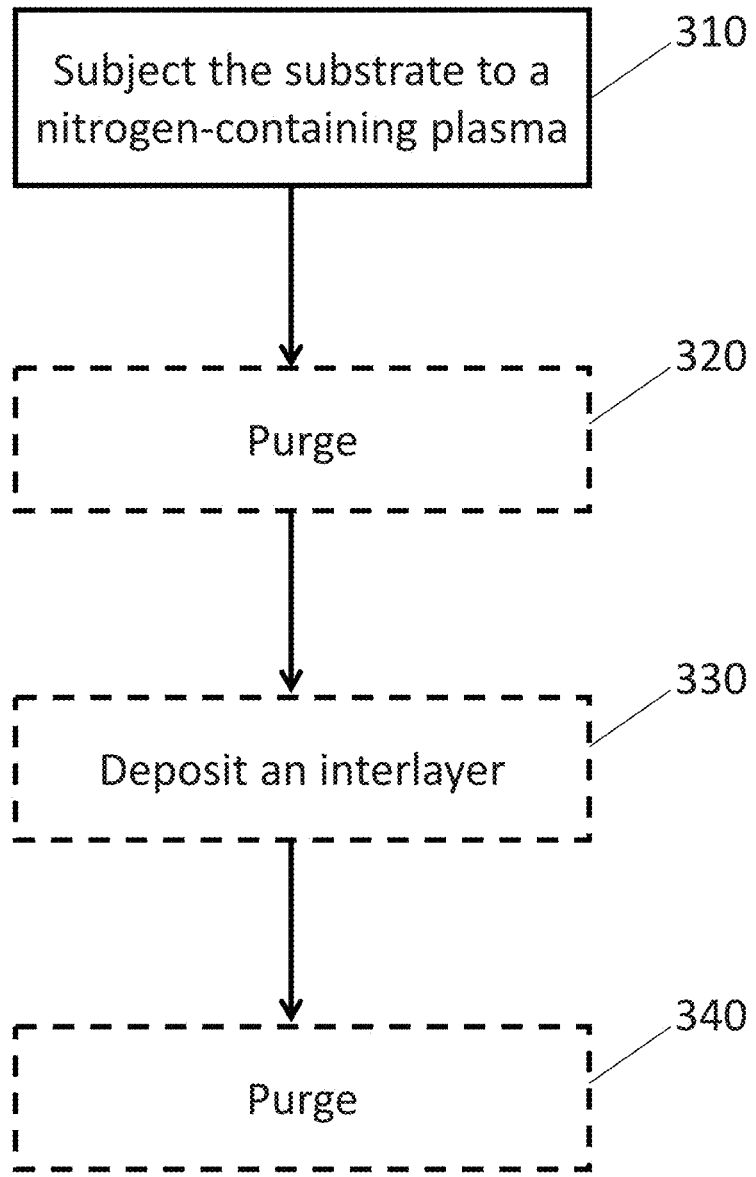
FIG. 3 shows an embodiment of a method (300) for depositing a barrier layer as described herein.

FIG. 3 shows an embodiment of a method (300) for depositing a barrier layer as described herein. This embodiment comprises a step (310) of subjecting a substrate to a nitrogen-containing plasma. Thus, a barrier layer can be formed. Optionally, the method (300) further comprises a step (330) of depositing an interlayer. Optionally, the step (310) of subjecting the substrate to a nitrogen-containing plasma and the step (330) of depositing an interlayer are separated by a purge (320). Optionally, the step (330) of depositing an interlayer is followed by another purge (340).

Figure 4:
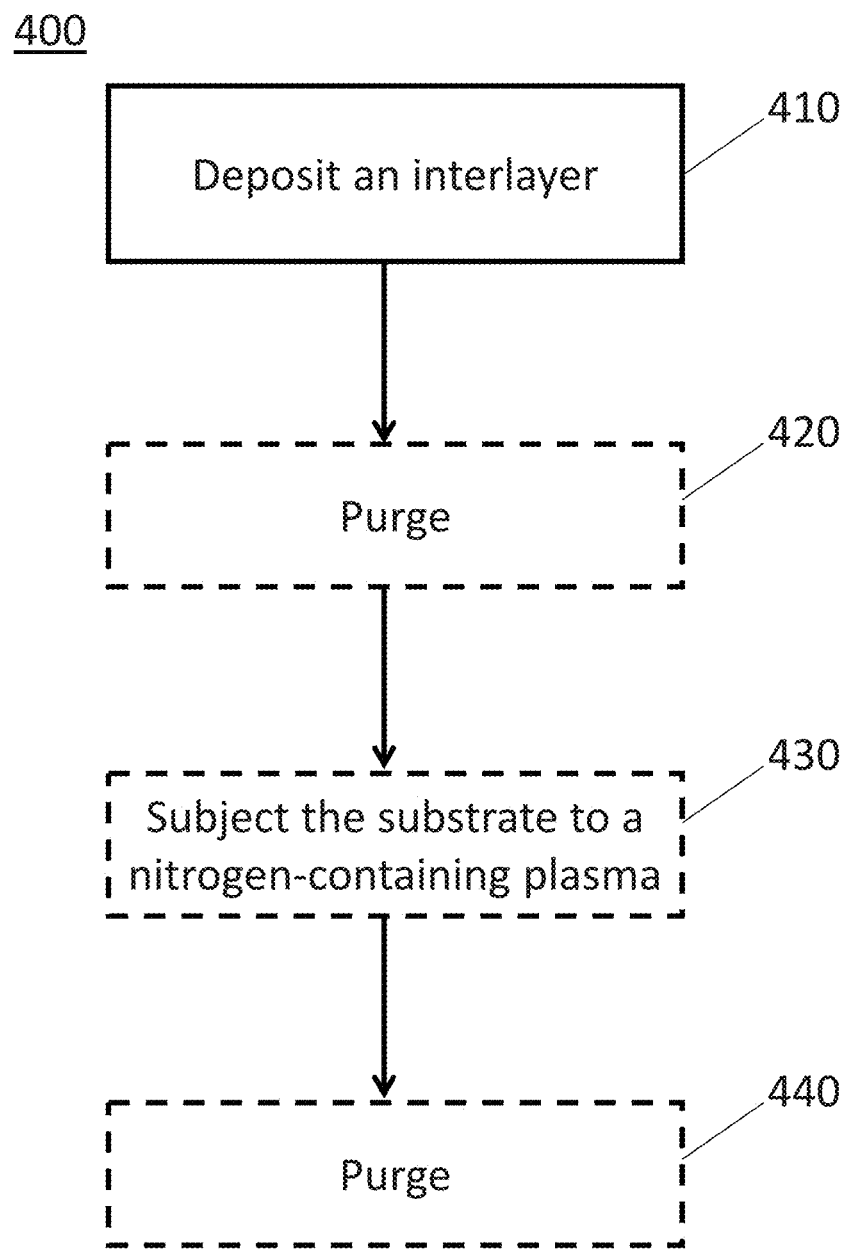
FIG. 4 shows an embodiment of a method (400) for depositing a barrier layer as described herein.

FIG. 4 shows an embodiment of a method (400) for depositing a barrier layer as described herein. This embodiment comprises a step (410) of depositing an interlayer on a substrate. Thus, a barrier layer can be formed. Optionally, the method (400) further comprises a step (430) of subjecting the substrate to a nitrogen-containing plasma. Optionally, the step (410) of depositing an interlayer and the step (430) of subjecting the substrate to a nitrogen-containing plasma are separated by a purge (420). Accordingly, a plasma-modified interlayer is formed. Optionally, the step (430) of subjecting the substrate to a nitrogen-containing plasma is followed by another purge (440).

Figure 5:
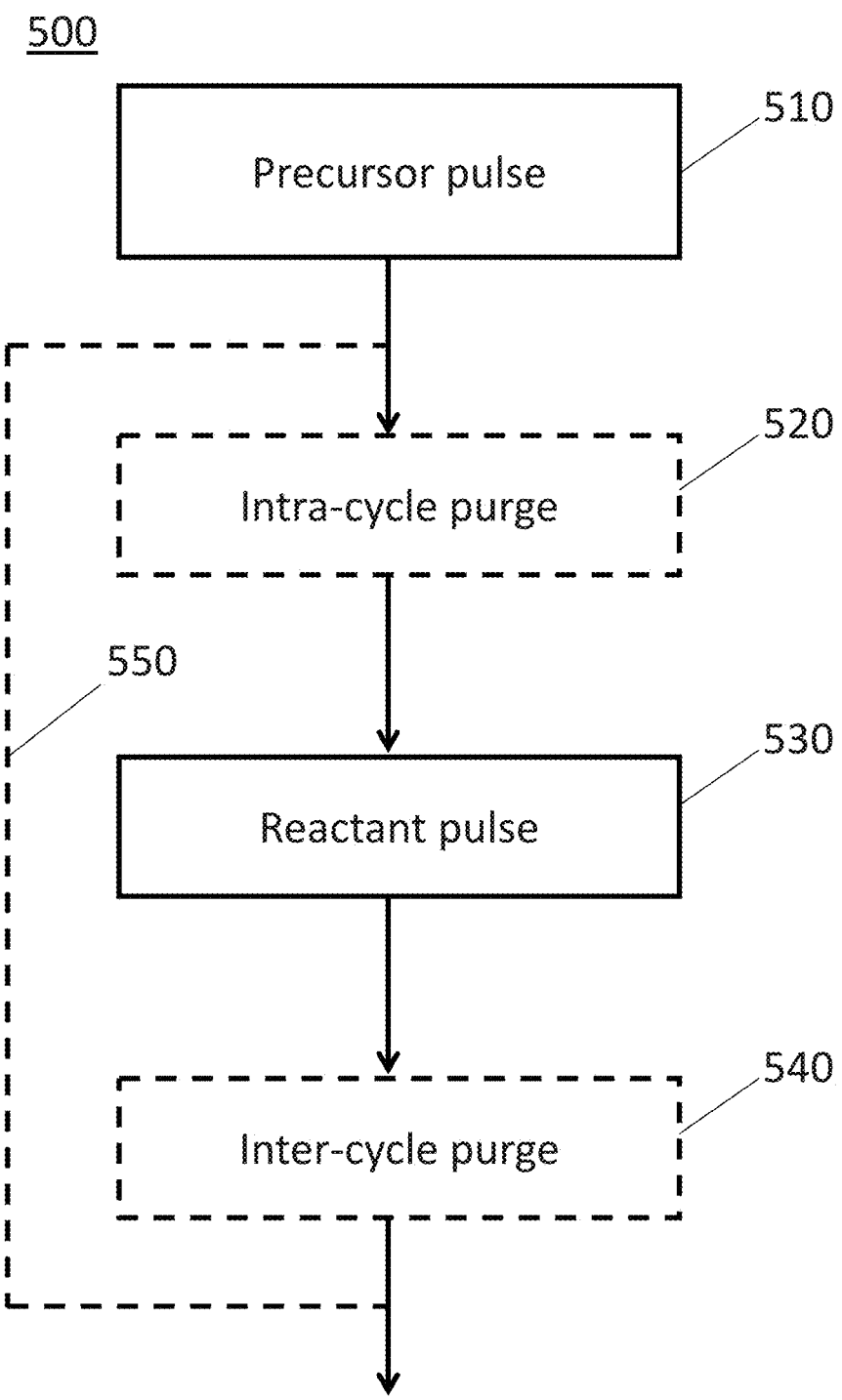
FIG. 5 shows an embodiment of a method (500) for depositing an interlayer as described herein.

FIG. 5 shows an embodiment of a method (500) for depositing an interlayer as described herein. This embodiment comprises providing a precursor to a reaction chamber in a precursor pulse (510), and providing a reactant to the reaction chamber in a reactant pulse (530). Together, the precursor pulse (510) and the reactant pulse (530) form a cycle. The cycle can be repeated (550) one or more times. Optionally, the precursor pulse (510) and the reactant pulse (530) are separated by means of an intra-cycle purge (520). Optionally, subsequent cycles are separated by an inter-cycle purge (540). An interlayer can thus formed on a substrate that is located in the reaction chamber. With every cycle, the thickness of the interlayer increases. When the interlayer has reached a pre-determined thickness, the method (500) ends. Optionally, the interlayer can then be subjected to a plasma treatment. Additionally or alternatively, a metal-containing layer can be deposited on the interlayer.

Figure 6:
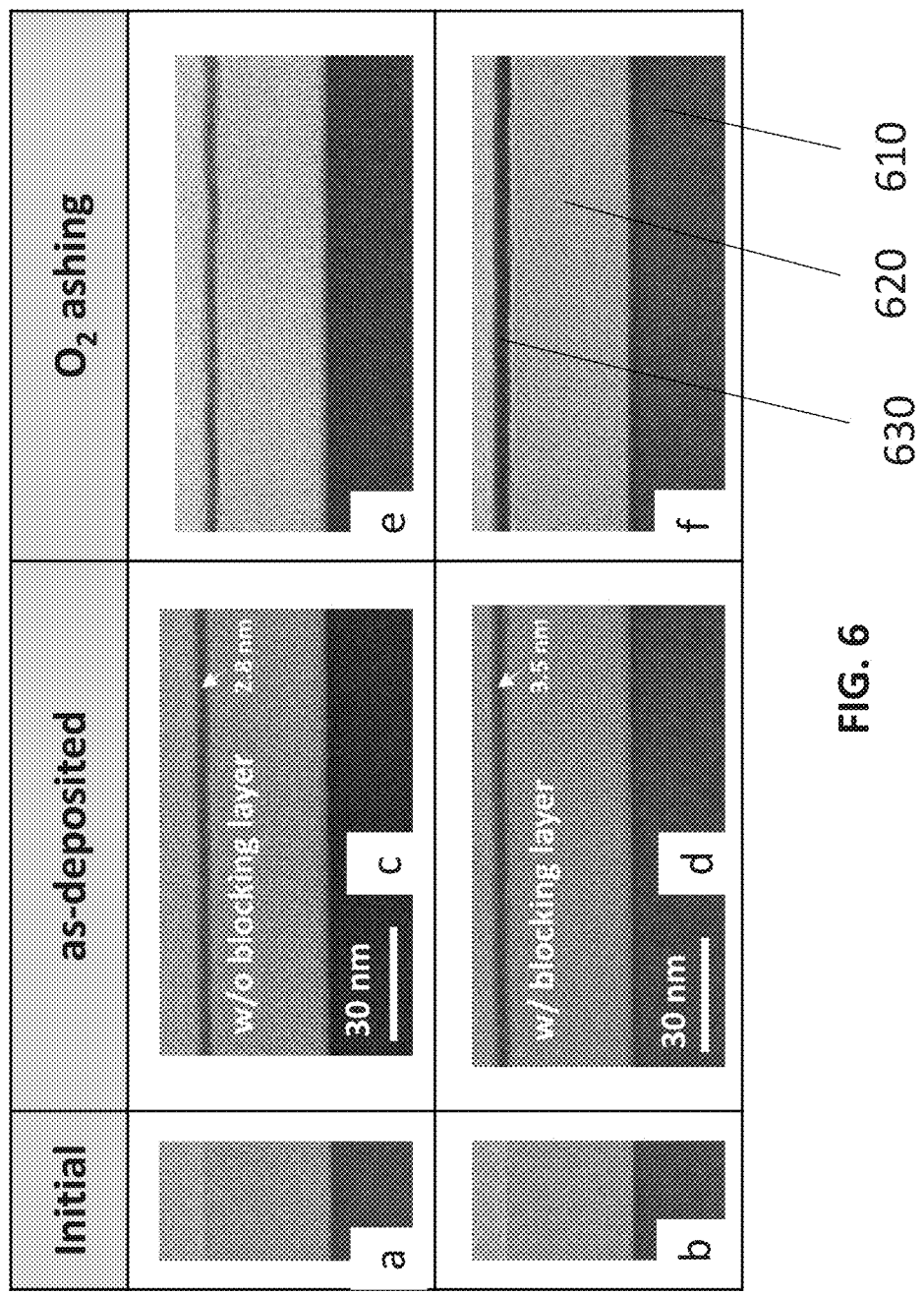
FIG. 6 shows experimental results, in particular transmission electron micrographs, of structures used employing a method according to an embodiment of the present disclosure.

FIG. 6 shows experimental results, in particular transmission electron micrographs, of structures used employing a method according to an embodiment of the present disclosure. In particular, micrographs a and b, marked "initial", show silicon substrates (610) on which an amorphous carbon layer (620) was deposited. The middle micrographs c and d, marked as-deposited, show the same substrates in which a metal-containing layer (630) has been deposited on the amorphous carbon layer (620). In micrograph d, a barrier layer (not visible), is positioned between the amorphous carbon layer (620) and the metal-containing layer (630). In micrograph c, the metal-containing layer (630) is directly deposited on the amorphous carbon layer (620), and no barrier layer is present. Micrograph e shows the structure of micrograph c after exposure to an oxygen plasma. The resulting structure is rough. Micrograph f shows the structure of micrograph d after exposure to an oxygen plasma. The resulting structure is smooth, and less damaged than the structure shown in micrograph e. Thus the barrier layer advantageously results in a metal-containing layer which is better resistant to oxygen plasmas. The barrier layer, in this example, was particularly formed by first depositing an interlayer on the amorphous carbon layer. The interlayer was particularly deposited using a plurality of cycles of the following sequence: precursor pulse—purge—plasma exposure—purge. Any number of cycles can be used, depending on the desired layer thickness, for example from at least 1 cycle to at most 1000 cycles, or from at least 2 cycles to at most 500 cycles, or from at least 5 cycles to at most 200 cycles, or from at least 10 cycles to at most 100 cycles, or from at least 20 cycles to at most 50 cycles. In an embodiment according to the present example, 150 cycles were used. During the precursor pulse, a metal precursor was provided to the reaction chamber. In an embodiment according to the present example, a titanium precursor was used. Suitable titanium precursors include titanium alkoxides, such as C1 to C4 titanium alkoxides. More particular, titanium(IV) isopropoxide was used in an embodiment according to the present example. The precursor pulse lasted 0.7 seconds and the purge after the precursor pulse lasted 0.4 seconds. During the plasma exposure step, a noble gas plasma can be used. In an embodiment according to the present example, an argon plasma was used. Suitably, a plasma power density of at least 10 mW/cm$^2$ to at most 50 mW/cm$^2$ can be used. In an embodiment according to the present example, a plasma power density of 18 mW/cm$^2$ was used. In some embodiments, the reaction chamber is maintained at a pressure of at least 100 Pa to at most 10 000 Pa, or from at least 200 Pa to at most 5000 Pa, or from at least 500 Pa to at most 2000 Pa. In an embodiment according to the present example, the reaction chamber was maintained at a pressure of 900 Pa.

Figure 7:
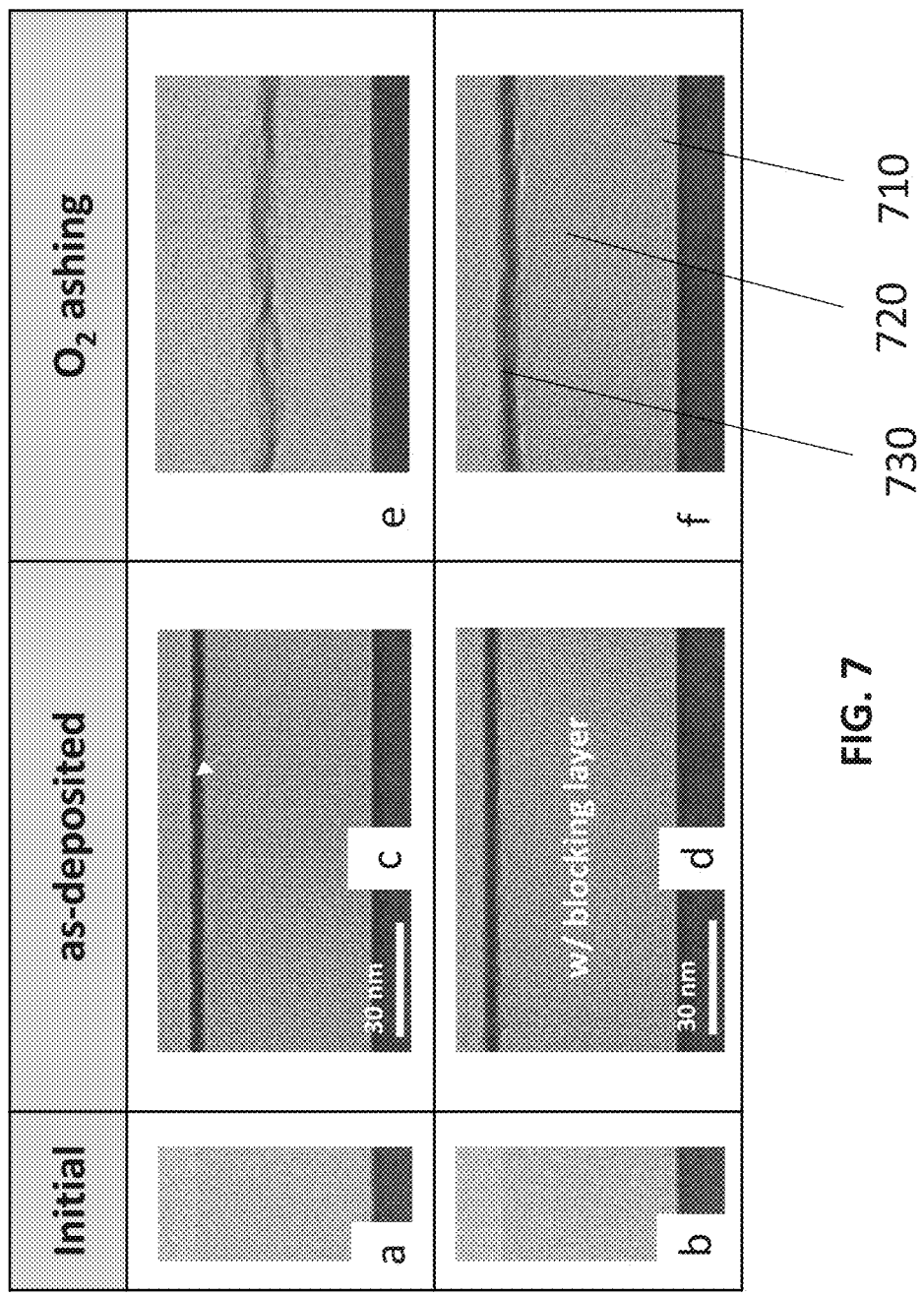
FIG. 7 shows experimental results, in particular transmission electron micrographs, of structures used employing a method according to an embodiment of the present disclosure.

FIG. 7 shows experimental results, in particular transmission electron micrographs, of structures used employing a method according to an embodiment of the present disclosure. The structures of FIG. 7 are similar to those shown in FIG. 6. In particular, the micrographs a and b, marked "initial", show silicon substrates (710) on which an amorphous carbon layer (720) was deposited. The amorphous carbon layer (720) of FIG. 7 is more porous than the amorphous carbon layer (620) of FIG. 6. The middle micrographs c and d, marked as-deposited, show the same substrates in which a metal-containing layer (730) has been deposited on the amorphous carbon layer (720). In micrograph d, a barrier layer (not visible), is positioned between the amorphous carbon layer (720) and the metal-containing layer (730). In micrograph c, the metal-containing layer (730) is directly deposited on the amorphous carbon layer (720), and no barrier layer is present. The barrier layer and the metal-containing layer (730) of FIG. 7 are deposited using identical methods as the barrier layer and the metal-containing layer (630) of FIG. 6. Micrograph e shows the structure of micrograph c after exposure to an oxygen plasma. Micrograph f shows the structure of micrograph d after exposure to an oxygen plasma. FIG. 7 shows that even a porous amorphous carbon layer can be efficiently protected during exposure to an oxygen plasma by means of a barrier layer as disclosed herein.

Figure 8:
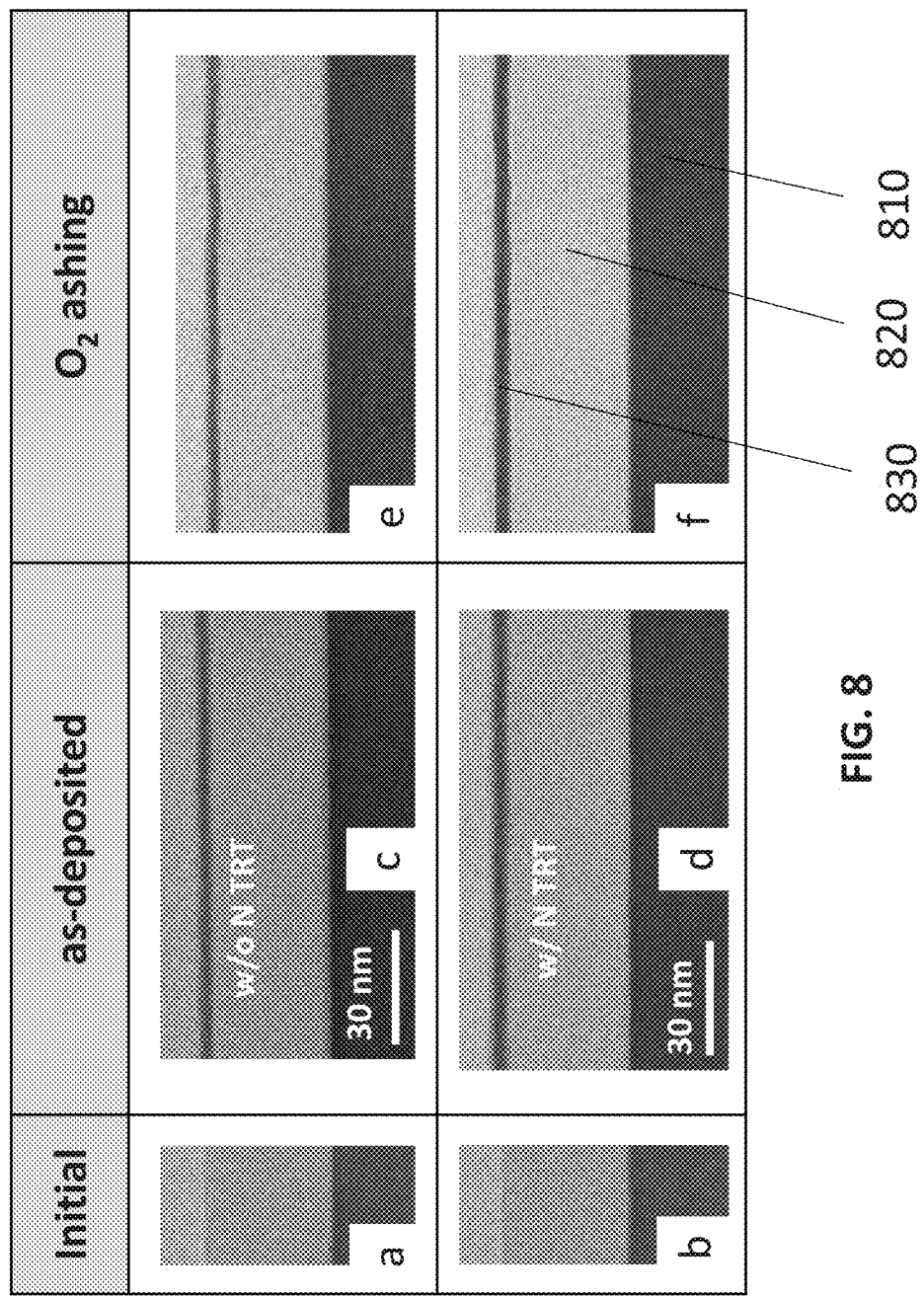
FIG. 8 shows experimental results, in particular transmission electron micrographs, of structures used employing a method according to an embodiment of the present disclosure.

FIG. 8 shows experimental results, in particular transmission electron micrographs, of structures used employing a method according to an embodiment of the present disclosure. In particular, the micrographs a and b, marked "initial", show silicon substrates (810) on which an amorphous carbon layer (820) was deposited. The middle micrographs c and d, marked as-deposited, show the same substrates in which a metal-containing layer (830) has been deposited on the amorphous carbon layer (820). In micrograph d, a barrier layer (not visible), is positioned between the amorphous carbon layer (820) and the metal-containing layer (830). In micrograph c, the metal-containing layer (830) is directly deposited on the amorphous carbon layer (820), and no barrier layer is present. Micrograph e shows the structure of micrograph c after exposure to an oxygen plasma. The resulting structure is rough. Micrograph f shows the structure of micrograph d after exposure to an oxygen plasma.

The resulting structure is smooth, and less damaged than the structure shown in micrograph e. Thus the barrier layer advantageously results in a metal-containing layer which is better resistant to oxygen plasmas. The barrier layer, in this example, was particularly formed by exposing the amorphous carbon layer to a capacitive, direct, and continuous, i.e. non-pulsed, nitrogen plasma in which $N_2$ was used as a plasma gas. The amorphous carbon layer can, in some embodiments, be exposed to the nitrogen plasma for at least 1 s to at most 10 s. In an embodiment according to the present example, the amorphous carbon layer was exposed to the nitrogen plasma for 3 s. Suitably, the reaction chamber in which the amorphous carbon layer is exposed to the nitrogen plasma can be purged after the plasma exposure, e.g. for a duration of at least 0.01 s to at most 1 s. In an embodiment according to the present example, the reaction chamber is purged for a duration of 0.1 s. The nitrogen plasma can have a plasma power density of at least 50 $mW/cm^2$ to at most 200 $mW/cm^2$. In an embodiment according to the present example, a plasma power density of 106 $mW/cm^2$ was used. In some embodiments, the reaction chamber is maintained at a pressure of at least 100 Pa to at most 10 000 Pa, or from at least 200 Pa to at most 5000 Pa, or from at least 300 Pa to at most 2000 Pa. In an embodiment according to the present example, the reaction chamber was maintained at a pressure of 400 Pa.

Figure 9:
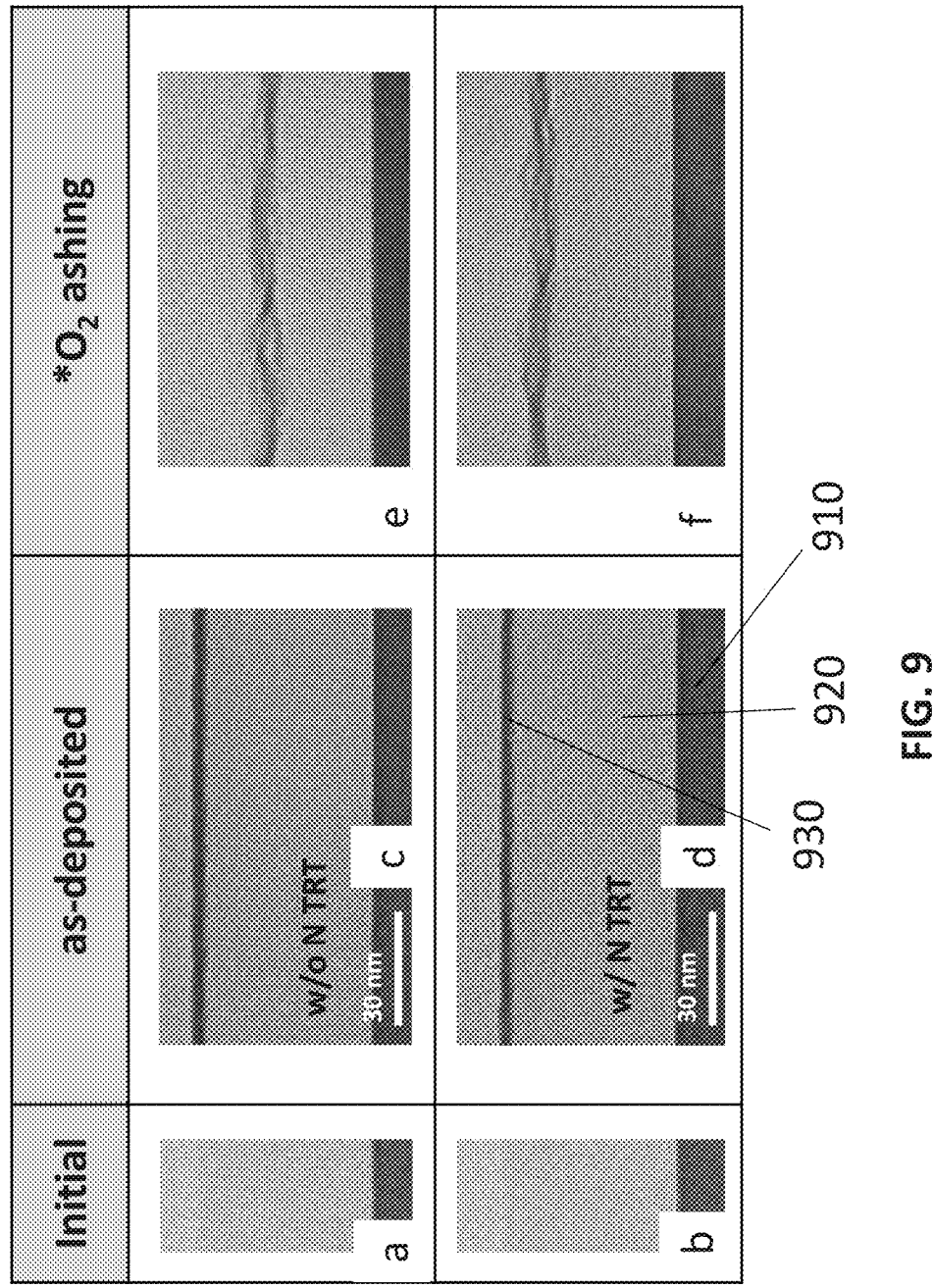
FIG. 9 shows experimental results, in particular transmission electron micrographs, of structures used employing a method according to an embodiment of the present disclosure.

FIG. 9 shows experimental results, in particular transmission electron micrographs, of structures used employing a method according to an embodiment of the present disclosure. In particular, the micrographs a and b, marked "initial", show silicon substrates (910) on which an amorphous carbon layer (920) was deposited. The amorphous carbon layer (920) of FIG. 9 is more porous than the amorphous carbon layer (820) of FIG. 8. The middle micrographs c and d, marked as-deposited, show the same substrates in which a metal-containing layer (930) has been deposited on the amorphous carbon layer (920). In micrograph d, a barrier layer (not visible), is positioned between the amorphous carbon layer (920) and the metal-containing layer (930). In micrograph c, the metal-containing layer (930) is directly deposited on the amorphous carbon layer (920), and no barrier layer is present. The barrier layer and the metal-containing layer (930) of FIG. 9 are deposited using identical methods as the barrier layer and the metal-containing layer (830) of FIG. 8. Micrograph e shows the structure of micrograph c after exposure to an oxygen plasma. Micrograph f shows the structure of micrograph d after exposure to an oxygen plasma. FIG. 9 shows that even a porous amorphous carbon layer can be efficiently protected during exposure to an oxygen plasma by means of a barrier layer as disclosed herein, although the protection is clearly not as effective as when a less porous amorphous carbon layer is used, as shown by FIG. 8.

Figure 10:
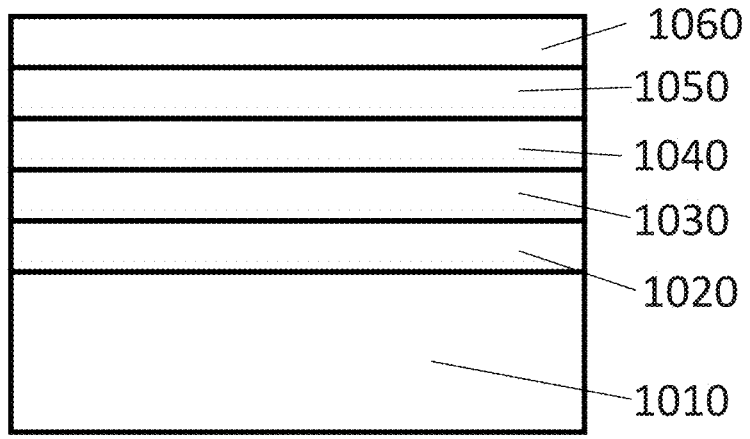
FIG. 10 illustrates a structure (1000) in accordance with exemplary embodiments of the disclosure.

FIG. 10 illustrates a structure (1000) in accordance with exemplary embodiments of the disclosure. The structure (1000) can be formed using a method as disclosed herein. The structure (1000) includes a substrate (1010), a patternable layer (1020), a surface layer (1030), a barrier layer (1040), a metal-containing layer (1050), and a photoresist layer (1060).

The substrate (1010) can include a substrate as described herein. By way of examples, the substrate (1010) can include a semiconductor substrate, such as a bulk material, such as silicon (e.g., single-crystal silicon), other Group IV semiconductor material, Group III-V semiconductor material, and/or Group II-VI semiconductor material and can include one or more layers (e.g., a patterning stack) overlying the bulk material. Further, as noted above, the substrate (1010) can include various topologies, such as recesses, lines, and the like formed within or on at least a portion of a layer of the substrate.

The patternable layer (1020) can be patterned and etched using a surface layer (1030), a barrier layer (1040), a metal-containing layer (1050), and a photoresist layer (1060) as described herein. Exemplary materials suitable for the patternable layer (1020) include, for example, oxides or nitrides, e.g. oxides or nitrides of silicon, another group IV element, or a transition metal.

Suitable surface layers (1030), barrier layers (1040), metal-containing layers (1050), and photoresist layers (1060) are described in detail elsewhere herein.

In some embodiments, the metal-containing layer (1050) can include one or more of a metal oxide, a metal nitride, and a metal oxynitride. The metal-containing layer (1050) can, in some embodiments, include added carbon. For example, the metal-containing layer (1050) can have a uniform carbon concentration or a carbon concentration grading. The metal-containing layer (1050) has a thickness that depends on the composition of the patternable layer (1020), the thickness of the patternable layer (1050), the specific photoresist which is used in the photoresist layer (1060), and the like. Suitable metal-containing layer thicknesses include thicknesses less than 5 nm, or less than 3 nm, or less than 2 nm. Optionally, the surface of the metal-containing layer (1050) can be treated, e.g. by exposing the substrate to a plasma after deposition of the metal-containing layer (1050). Thus, a suitable surface termination can be obtained which can, in some embodiments, promote adhesion with the photoresist layer (1060).

Figure 11:
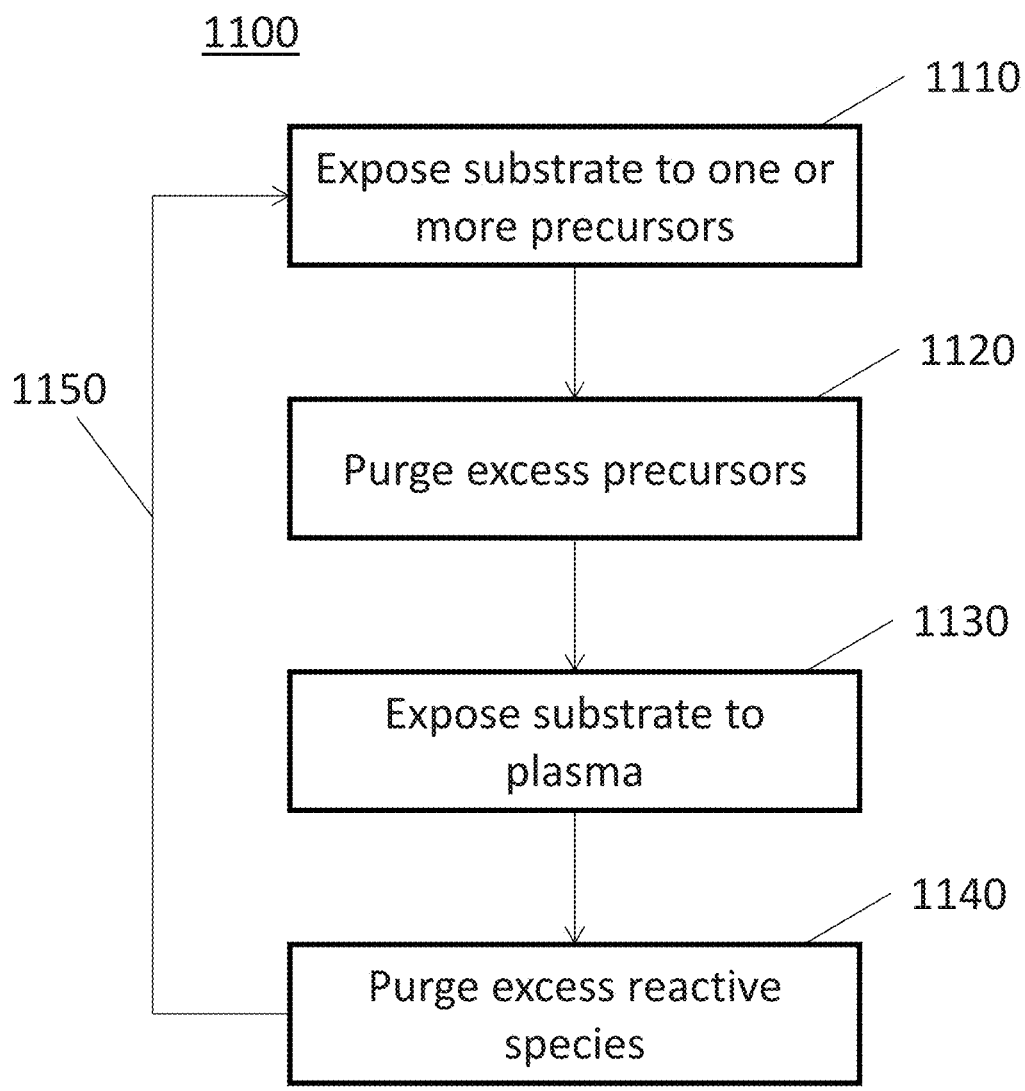
FIG. 11 shows an exemplary process flow (1100) for depositing a metal-containing layer or a part thereof by means of plasma-enhanced chemical vapor deposition.

FIG. 11 shows an exemplary process flow (1100) for depositing a metal-containing layer or a part thereof by means of plasma-enhanced chemical vapor deposition. In the process (1100), a substrate in a reaction chamber is exposed to one or more precursors (1110). Then, excess precursor may be purged from the reaction chamber (1120). Thereafter, the substrate may be subjected to a plasma (1130). For example, in order to manufacture an upper metal-containing layer part having good adhesion properties, a noble gas plasma may be used, e.g. a He, Ne, Ar, Kr plasma. After the plasma step, excess reactive species such as ions and radicals are suitably purged from the reaction chamber (1140). The aforementioned steps form a cycle. These cycles can be repeated (1150) any number of times in order to deposit a metal-containing layer or a part thereof having a desired thickness.

In some embodiments, the metal-containing layer or a part thereof is deposited using a thermal atomic layer deposition process as opposed to plasma-enhanced atomic layer deposition. In such embodiments, it can be particularly advantageous to subject the metal-containing layer to a plasma, e.g. a noble gas plasma, after it has been deposited. Such post-treatment may advantageously densify the metal-containing layer.

Figure 12:
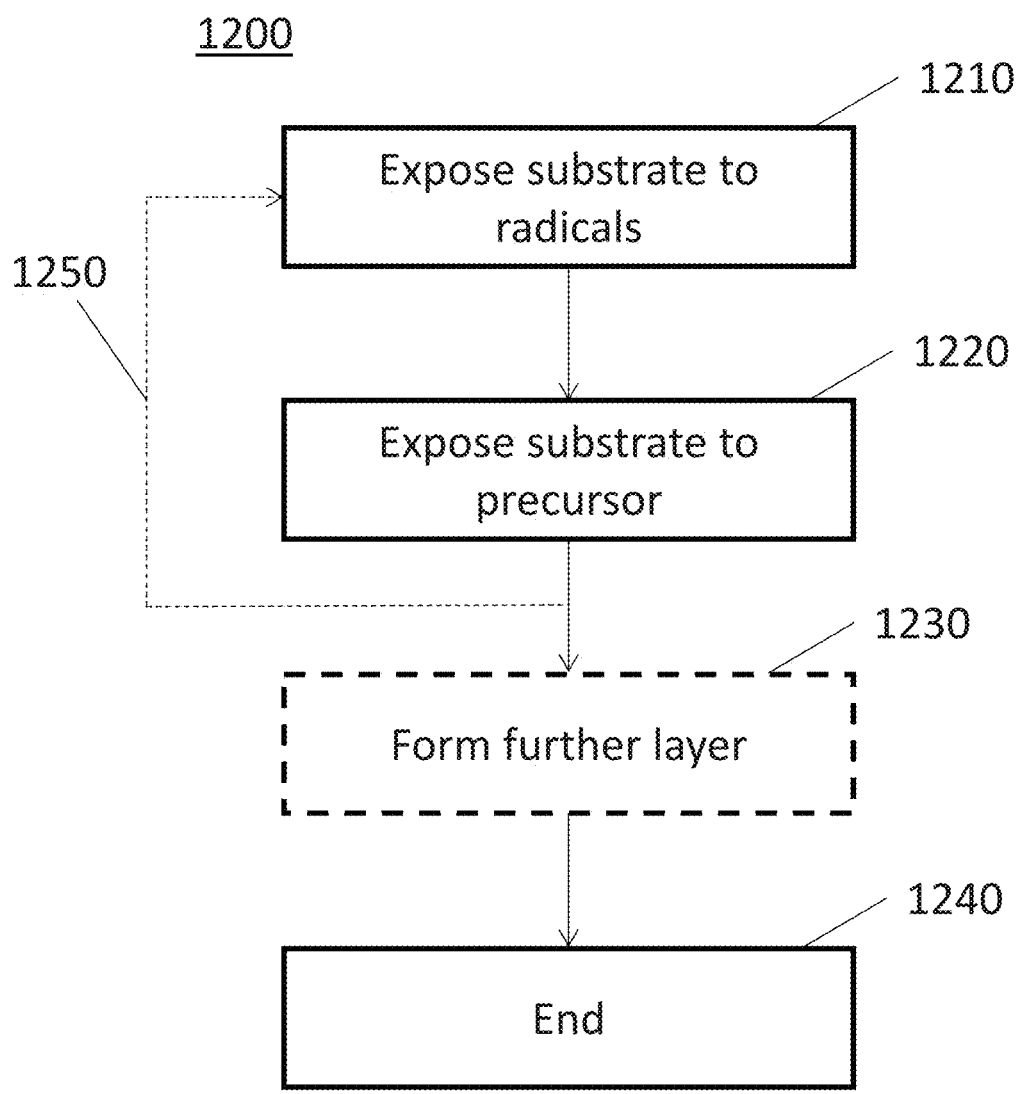
FIG. 12 shows another exemplary embodiment of a method in accordance with examples of the disclosure.

FIG. 12 shows an exemplary embodiment of a method (1200) as described herein. In particular, the method (1200) of FIG. 12 comprises a step (1210) of exposing a substrate to radicals. Suitable radicals include the radicals described herein. Then, the method (1200) of FIG. 12 comprises a step (1220) of exposing the substrate to a precursor. Suitably, the steps (1210,1220) of exposing the substrate to radicals and exposing the substrate to a precursor can be separated by a purge. Suitable precursors include the precursors described herein. Optionally, the steps (1210,1220) of exposing the substrate to radicals and a precursor can be repeated (1250)

one or more times. Suitably, the resulting cycles can be separated by a purge. Thus, a barrier layer can be formed on the substrate. Optionally, the method further comprises forming a further layer (1230) on the substrate. A method such as that of FIG. 12 can suitably allow forming a further layer (1230) with easier nucleation on certain substrates, such as substrates containing a C—H terminated amorphous carbon surface layer.

In some embodiments, the radicals are selected from oxygen radicals and nitrogen radicals. Suitably, oxygen radicals can be generated using an $O_2$ remote plasma. Suitably, nitrogen radicals can be generated using an $N_2$ or $NH_3$ remote plasma. It shall be understood that the terms $O_2$ remote plasma and $N_2$ remote plasma refer to remote plasmas that employ a plasma gas containing $O_2$ or $N_2$, respectively. The plasma gas can suitably contain other gasses as well, such as a noble gas. Suitable noble gasses include He, Ne, Ar, Kr, and Xe.

In some embodiments, the precursor comprises a metal precursor or a silicon precursor. Suitable silicon precursors include alkylaminosilanes such as N-(diethylaminosilyl)-N-ethylethanamine. Suitable metal precursors include compounds comprising alkylamine ligands such as tetrakis(dimethylamido)titanium. Other suitable metal precursors include compounds comprising alkoxide ligands such as titanium isopropoxide.

In some embodiments, the above-mentioned cyclic process comprising alternating radical and precursor exposures can be employed for forming the entire barrier layer. Alternatively, one or more cycles comprising alternating radical and precursor exposures can be followed by forming a further layer using a different deposition process. Exemplary further deposition processes include plasma-enhanced deposition processes such as plasma-enhanced atomic layer deposition processes employing alternating direct plasma exposures and precursor exposures. In other words, a further deposition can comprise one or more cycles comprising a direct plasma pulse and a precursor pulse. The direct plasma pulse comprises exposing the substrate to a direct plasma such as a direct oxygen plasma or a direct nitrogen plasma. The precursor pulse comprises exposing the substrate to a precursor such as a silicon precursor or a metal precursor. Suitable oxygen plasmas include $O_2$ plasmas. Suitable nitrogen plasmas include $N_2$ plasmas.

In some embodiments, the above-mentioned cyclic process comprising alternating radical and precursors can be employed until a barrier layer having a thickness of less than 2 nm, e.g. having a thickness of at least 0.3 nm to at most 1.5 nm, has been formed; and a further layer is formed using alternating direct plasma pulses and precursor pulses. Thus, the underlying substrate can be suitably protected from ion bombardment from the direct plasma by the barrier layer that was formed using the radical-enhanced deposition process.

The example embodiments of the disclosure described above do not limit the scope of the invention, since these embodiments are merely examples of the embodiments of the invention. Any equivalent embodiments are intended to be within the scope of this invention. Indeed, various modifications of the disclosure, in addition to the embodiments shown and described herein, such as alternative useful combinations of the elements described, may become apparent to those skilled in the art from the description. Such modifications and embodiments are also intended to fall within the scope of the appended claims.

We claim:

1. A method of forming a structure comprising, in the following order:
   providing a substrate to a reaction chamber, the substrate comprising a semiconductor and a surface layer, the surface layer comprising amorphous carbon;
   forming a barrier layer on the surface layer; and,
   depositing a metal-containing layer on the substrate, wherein the metal-containing layer comprises oxygen and a metal,
   wherein forming the barrier layer on the surface layer comprises exposing the surface layer to a nitrogen-containing plasma, thus forming a plasma-modified surface layer.

2. The method according to claim 1 wherein forming the barrier layer comprises converting a part of the surface layer into the barrier layer.

3. The method according to claim 1 wherein forming the barrier layer on the surface layer further comprises depositing an interlayer on the plasma-modified surface layer.

4. The method according to claim 1 wherein forming the barrier layer on the surface layer comprises depositing an interlayer on the plasma-modified surface layer.

5. The method according to claim 4 wherein forming the barrier layer on the surface layer further comprises exposing the interlayer to a nitrogen-containing plasma, thus forming a plasma-modified interlayer.

6. The method according to claim 3 wherein depositing the interlayer comprises a cyclical process comprising a plurality of subsequent cycles, a cycle comprising an interlayer precursor pulse and an interlayer reactant pulse, the interlayer precursor pulse comprising providing an interlayer precursor to the reaction chamber, and the interlayer reactant pulse comprising providing an interlayer reactant to the reaction chamber.

7. The method according to claim 6 wherein the interlayer precursor is selected from the list consisting of a silicon precursor, a titanium precursor, and a tantalum precursor.

8. The method according to claim 6 wherein the interlayer reactant is an oxygen reactant.

9. The method according to claim 8 wherein the oxygen reactant comprises a gaseous species selected from $O_2$, $O_3$, $H_2O$, $H_2O_2$, $N_2O$, NO, $CO_2$, CO, and $NO_2$.

10. The method according to claim 6 wherein neither the step of providing an interlayer precursor to the reaction chamber nor step of providing an interlayer reactant to the reaction chamber comprises generating a plasma in the reaction chamber.

11. The method according to claim 4 wherein the interlayer has a thickness of 3 nm or less.

12. The method according to claim 1 further comprising a step of depositing a photoresist layer on the metal-containing layer.

13. The method according to claim 12 wherein the photoresist layer comprises an EUV photoresist.

14. The method according to claim 1 wherein the step of depositing the metal-containing layer on the substrate comprises a cyclical deposition process comprising a plurality of subsequent cycles, a cycle comprising a metal-containing layer precursor pulse and a metal-containing layer reactant pulse.

15. The method according to claim 14 wherein at least one of the metal-containing layer precursor pulse and the metal-containing layer reactant pulse is preceded by a purge.

16. The method according to claim 14 wherein the metal-containing layer precursor pulse comprises providing a metal-containing precursor to the reaction chamber, the metal-containing precursor having a general formula M[R $(C_xH_y)_n]_4$, where M is selected from Ti, Ta, Hf, Zn, and Zr, wherein R is selected from OCH and N, wherein x is 1-2, wherein y is 3-6, and wherein n is 2-3.

17. The method according to claim 14 wherein the metal-containing layer reactant pulse comprises providing a metal-containing layer reactant to the reaction chamber, the metal-containing layer reactant being selected from $H_2O$, $O_3$, and $H_2O_2$.

18. The method according to claim 14 wherein the metal-containing layer reactant pulse comprises generating a plasma in the reaction chamber, the plasma being selected from a hydrogen-containing plasma and an oxygen-containing plasma.

19. The method according to claim 1 wherein forming the barrier layer on the surface layer comprises exposing the substrate to radicals.

20. A system comprising:
a reaction chamber;
a gas injection system fluidly coupled to the reaction chamber;
a first gas source for introducing a precursor and optionally a carrier gas into the reaction chamber;
a second gas source for introducing a mixture of one or more further gasses into the reaction chamber;
an exhaust; and
a controller,
wherein the controller is configured to control gas flow into the gas injection system and for causing the system to carry out a method according to claim 1.

* * * * *